(12) United States Patent
Kieffer et al.

(10) Patent No.: US 7,094,061 B1
(45) Date of Patent: Aug. 22, 2006

(54) PRINTED CIRCUIT BOARD WITH INTEGRAL STRAIN GAGE

(75) Inventors: Thomas P. Kieffer, Wake Forest, NC (US); Robert B. Watson, Clayton, NC (US)

(73) Assignee: Vishay Measurements Group, Inc., Raleigh, NC (US)

( * ) Notice: Subject to any disclaimer, the term of this patent is extended or adjusted under 35 U.S.C. 154(b) by 0 days.

(21) Appl. No.: 11/063,318

(22) Filed: Feb. 22, 2005

(51) Int. Cl.
*H01R 12/00* (2006.01)

(52) U.S. Cl. .......................... 439/65; 73/862

(58) Field of Classification Search ............... 439/61, 439/65, 67; 310/330, 328; 345/161; 73/849, 73/768, 862, 775, 777; 360/294, 245.9
See application file for complete search history.

(56) References Cited

U.S. PATENT DOCUMENTS

| | | |
|---|---|---|
| 5,328,551 A | 7/1994 | Kovacich |
| 5,392,027 A | 2/1995 | Brunot et al. |
| 5,404,124 A * | 4/1995 | Ruppin et al. ............... 338/2 |
| 5,526,208 A * | 6/1996 | Hatch et al. ............. 360/294.1 |
| 6,948,377 B1* | 9/2005 | Wingett et al. ............... 73/795 |
| 7,036,387 B1* | 5/2006 | Ong et al. ............. 73/862.637 |

FOREIGN PATENT DOCUMENTS

| | | |
|---|---|---|
| JP | 03 276003 A | 12/1991 |
| JP | 2001 015882 A | 1/2001 |

OTHER PUBLICATIONS

Mars, J.R., "New strain gages are similar to thin film resistors, permit analysis of multilayer boards", Insulation/Circuits, vol. 19 (11):Oct. 1, 1973 pp. 35-37.

* cited by examiner

*Primary Examiner*—Alexander Gilman
(74) *Attorney, Agent, or Firm*—McKee, Voorhees & Sease, P.L.C.

(57) ABSTRACT

An integral strain measurement layer for use in an assembly printed circuit board to provide for strain measurement on the printed circuit board. The strain measurement layer includes an insulating layer having a top surface and a bottom surface, a strain sensitive layer of metallic foil adhered to the top surface of the insulating layer for measuring strain associated with the printed circuit board, and a copper coating disposed on the strain sensitive layer of metallic foil.

15 Claims, 2 Drawing Sheets

PRINTED CIRCUIT BOARD WITH INTEGRAL STRAIN GAGE

BACKGROUND OF THE INVENTION

The present invention relates to a printed circuit board with an integral strain gage. Although the present invention addresses numerous problems, specific problems related to the manufacturing of printed circuit boards are discussed herein to provide a background of the invention.

During printed circuit board manufacturing, it is advantageous to measure strain associated with a printed circuit boards. Strain measurements can be used for stress analysis purposes. During the manufacturing processes printed circuit boards undergo a variety of operations that can be stressful. For example populating a board during one manufacturing operation may cause damage to connections made in a previous manufacturing operation. Locating and monitoring areas where strain is being produced on a printed circuit board is desirable. Knowledge regarding strain can be used to assess electronic component failure modes within a printed circuit board to thereby alter or improve the manufacturing process as necessary to reduce or eliminate defects and/or otherwise improve quality.

This problem has been addressed in the prior art by using conventional discrete strain gages attached to the surface of the printed circuit board with separate signal lead wires attached to the strain gage. In such an approach discrete strain gage sensors are glued to the top surface of the printed circuit board and attached to electrical circuitry via leadwires attached to the sensors.

In the case of prior art strain gages, there is a significant installation cost associated with placing a strain gage on a printed circuit board. This step is performed by a technician which is time-consuming and costly. This type of labor intensive installation process is not consistent with the goals of an automated assembly process or a high volume PCB manufacturing environment. Moreover, because an automated process is not used the results obtained from strain gages installed in this manner may not be as accurate or useful as desired due to inconsistencies between installations.

An alternative prior art approach has been to use strain-sensitive material applied by metal deposition directly to the board. This approach has allowed some use of printed circuit board manufacturing techniques, however there are significant disadvantages. In particular deposited metal does not provide the requisite strain-sensitive properties that may be required in more sensitive applications. Also, although printed circuit board manufacturing techniques are used, the use of a metal deposition step for the strain gage is a significant addition to the manufacturing process that may be cost prohibitive in particular applications.

A further problem is that with the prior art approaches there are numerous limitations as to where strain can be measured. Strain sensors can not be located in positions which are not readily accessible. Every place where it may be advantageous or appropriate to measure strain is simply not accessible with a discrete sensor.

Thus, despite these varying approaches used in the prior art, problems remain. Therefore, it is a primary object, feature or advantage of the present invention to improve upon the state of the art.

Another object, feature, or advantage of the present invention is to provide for accurately and efficiently locating areas of stress in a printed circuit board.

It is a further object, feature or advantage of the present invention to provide a printed circuit board with an integral strain gage as opposed to a discrete strain gage.

It is a still further object, feature or advantage of the present invention is to provide an integral strain gage that does not require deposition of material directly on the printed circuit board.

Another object, feature or advantage of the present invention is to provide an integral strain gage that is compatible with a multi-layer printed circuit board.

Yet another object, feature or advantage of the present invention is to provide an integral strain gage for use in a printed circuit board that allows for flexibility with respect to where in the printed circuit board the strain gage is placed.

A further object, feature or advantage of the present invention is to provide an integral strain gage that does not require using discrete sensors attached to the top surface of the printed circuit board.

A still further object, feature, or advantage of the present invention is to provide an integral strain gage in a printed circuit board suitable for transducer purposes such as measuring deflection or force.

Another object, feature, or advantage of the present invention is to provide an integral strain gage in a printed circuit board that is accurate.

One or more of these and/or other objects, features, or advantages of the present invention will become apparent from the specification and claims that follow.

SUMMARY OF THE INVENTION

According to one aspect of the present invention a strain measurement layer for use in assembling a printed circuit board to provide for strain measurement on the printed circuit board is provided. The strain measurement layer includes an insulating layer having a top surface and a bottom surface. There is a strain sensitive layer of metallic foil adhered to the top surface of the insulating layer for measuring strain associated with the printed circuit board. There is a copper coating disposed on the strain-sensitive layer of metallic foil. The layer may also include a second strain sensitive layer on the bottom surface of the insulating layer and a second copper coating on the second strain sensitive layer. The strain sensitive layer may be patterned to provide one or more strain gage features. The copper coating may be patterned to provide for circuit features.

According to another aspect of the invention, a printed circuit board includes a plurality of layers where at least one of the layers is a strain measurement layer adapted to provide for strain measurement of the printed circuit board. The strain measurement layer includes an insulating layer having a top surface and a bottom surface, a strain sensitive layer of metallic foil adhered to the top surface of the insulating layer for measuring strain associated with the printed circuit board and a copper coating disposed on the strain sensitive layer of metallic foil. The strain sensitive layer may be an outer layer or an inner layer. Also more than one strain sensitive layer can be used. Both the strain sensitive layer may be patterned to form various strain gage features. Similarly, the copper coating may be patterned to provide various circuit features.

According to another aspect of the invention, a method for strain measurement on a printed circuit board is provided. The method includes providing a printed circuit board having a plurality of layers where at least one of the layers is a strain measurement layer having an insulating layer and a strain sensitive metallic foil adhered to the insulating layer for measuring strain associated with the printed circuit board. According to the method, strain is associated with the strain sensitive metallic foil as measured. The method allows for locating an area of high stress based on the strain. For example, the method provides for locating an area of high stress associated with solder connection failure in the printed circuit board. The resulting strain measurements can be used to provide information necessary to appropriately modify manufacturing process based on location of the areas of high stress.

DETAILED DESCRIPTION OF THE PREFERRED EMBODIMENT

The invention provides for an integral strain-sensitive layer in a printed circuit board. The integral strain-sensitive layer addresses the problems of strain measurement on a printed circuit board while allowing the use of printed circuit board manufacturing techniques to locate the point of strain measurement and to connect the strain sensor to the appropriate electrical circuitry.

Figure 1:
FIG. 1 illustrates one embodiment of a side view of a printed circuit board according to the present invention.

FIG. 1 illustrates a side view one embodiment of a printed circuit board 10 having multiple layers. The multiple layers include an outer layer 12, an inner layer 14 and a second outer layer 16, the inner layer 14 sandwiched between the outer layer 12 and the second outer layer 16. Although only three layers are shown, the present invention contemplates that printed circuit boards may have any number of layers, one or more of which may be strain measurement layers. To assist in describing the invention, FIG. 2 illustrates a strain measurement layer which is an outer layer, FIG. 3 illustrates a strain measurement layer which is an inner layer, and FIG. 4 illustrates that a multi-layer board can have multiple strain measurement layers.

Figure 2:
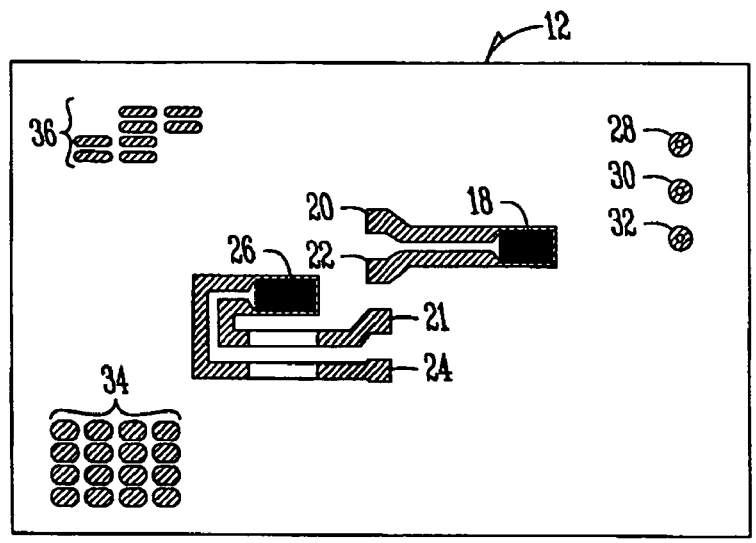
FIG. 2 illustrates one embodiment of a strain measurement layer according to one embodiment of the present invention.

FIG. 2 illustrates a top view of one embodiment of a strain measurement layer 12. The strain measurement layer 12 includes a number of different features. The features include high resistance strain sensor features such as strain sensitive grids 18 and 26. In addition, there are conventional features such as circuit traces 20, 21, 22, 24 for low resistance electrical signal transmission to each of the strain sensitive grids 18, 26. Another conventional feature includes low resistance attachment points 28, 30, 32 for non-strain sensitive components. There is also a plurality of pads 34, 36 for low resistance attachment to non-strain sensitive components. The features 20, 21, 22, 24, 28, 30, 32, 34, and 36 are preferably copper features. The various features are shown are merely illustrative as the strain measurement layer is configurable to whatever circuit design and combination of features desired by its users through removal processes.

Figure 3:
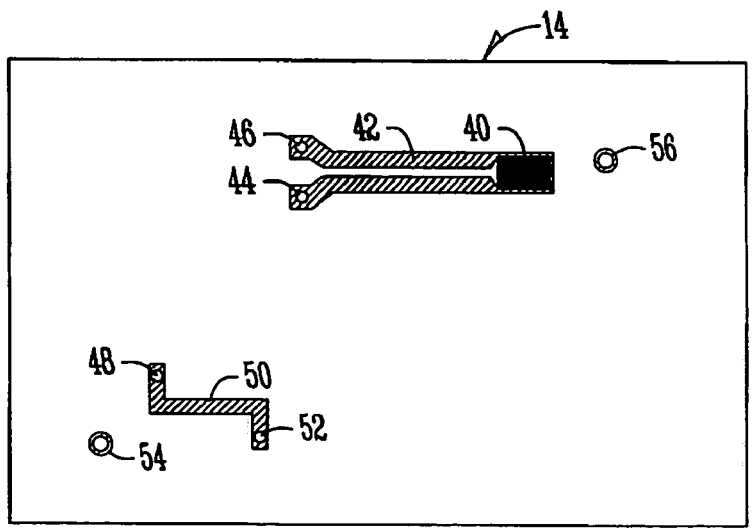
FIG. 3 illustrates a view of one embodiment of a strain measurement layer which is an internal layer according to one embodiment of the present invention.

FIG. 3 illustrates one embodiment of an inner layer having strain sensor features. It should be apparent that the strain measurement layer of the present invention can be either an outer layer or an inner layer. As shown in FIG. 3, inner layer 14 has a strain sensor feature 40. Also, there are conventional circuit features such as circuit traces 42 for low resistance electrical signal transmission to the strain sensitive grid 40. Other features shown include low resistance drilled attachment via 44, 46 for routing electrical signals from the strain sensitive feature 40. Other features shown also include low resistance drilled attachment via 48, 52 for routing electrical signals from non-strain sensitive components. A circuit trace 50 is also shown as is a low resistance attachment point 54 for non-strain sensitive components. A low resistance drilled attachment via 56 for routing electrical signals from non-strain sensitive components is also shown. The various features shown are merely illustrative.

Figure 4:
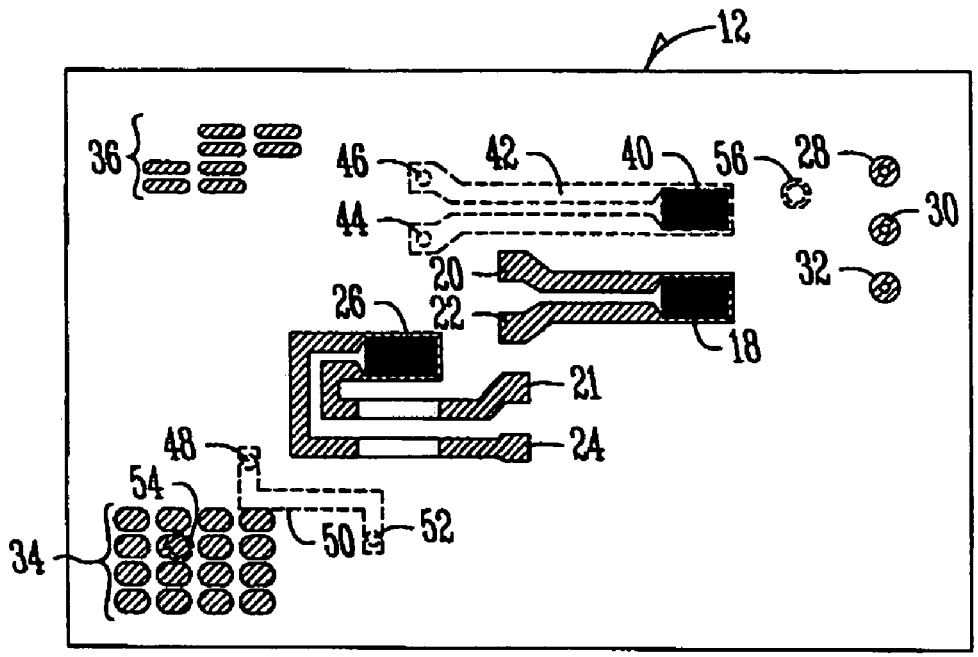
FIG. 4 illustrates a top view of one embodiment of a printed circuit board of the present invention having multiple strain measurement layers.

FIG. 4 is a top view of one embodiment of the printed circuit board having multiple strain measurement layers. FIG. 4 illustrates both the layers shown in FIGS. 2 and 3 combined with the features shown in FIG. 3 provided in hidden lines.

Thus, it is apparent that the present invention is consistent with printed circuit board manufacturing processes as a strain measurement layer can be inserted as a layer in a multi-layer printed circuit board. The same strain measurement layer can include strain sensor features as well as conventional features made of a conductor such as copper and can include via for interfacing with adjacent layers. Where the strain sensitive layer is an inner or subsurface layer any strain sensor features on the strain sensitive layer can be connected to electrical circuits via holes drilled through the strain sensor feature directly under or over electrical traces that are joined by conventional printed circuit board manufacturing techniques using plated and solder via, for example.

Figure 5:
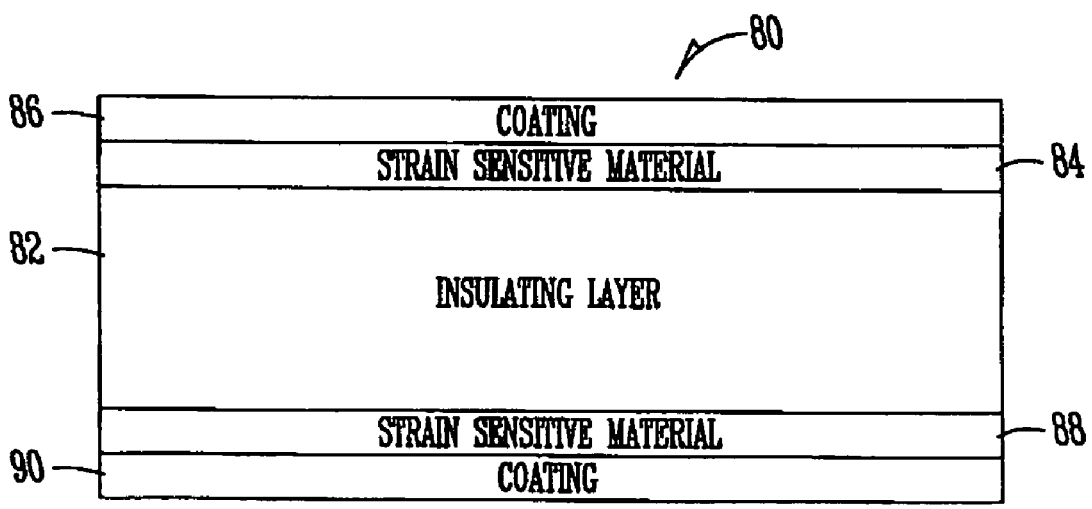
FIG. 5 illustrates a side view of a strain measurement layer according to one embodiment of the present invention.

FIG. 5 illustrates a side view of a strain measurement layer 80. Each strain measurement layer 80 is formed from an insulating layer 82 having a top surface and a bottom surface. There is a strain sensitive layer of metallic foil 84 adhered to the top surface of the insulating layer 82 for measuring strain associated with the printed circuit board. There is also a conductive coating 86, preferably of copper, disposed on the strain sensitive layer 84 of metallic foil. A strain measurement layer 80 may have the strain sensitive layer of metallic foil and the copper coating on one side or both sides as may be appropriate for a particular use. For example FIG. 5 illustrates a strain sensitive layer 88 adhered to the bottom surface of the insulating layer 82 with a conductive coating 90, disposed on the strain sensitive layer 88.

The insulating layer 82 is preferably of a polyimide material. The conductive coating 86, 90 is preferably copper coating. Preferably the strain sensitive layer is of a metallic foil of a material such as a nickel chromium alloy. Examples of suitable materials for the metallic foil include Karma or Constantan depending upon the particular properties desired. The metallic foil is preferably a rolled metallic foil. Preferably the strain sensitive layer is bonded to the insulating substrate with an epoxy adhesive, although the present invention contemplates that other types of adhesives may be used depending upon the particular properties desired. The strain measurement layer is typically less than about 2 mils in thickness.

During the printed board manufacturing process, the present invention contemplates using essentially standard printed circuit board techniques. It is observed that the strain measurement layer of the present invention may be somewhat more flexible than the types of layers normally used in printed circuit boards so some alterations in handling may be required in appropriate circumstances. The strain measurement layers of the present invention can be patterned using normal processes including etching. Where the strain measurement layer is etched to form strain sensor patterns, it is observed that typical chemicals used for removing copper may take longer to remove the portions of metallic foil than the copper coating, therefore other chemicals may be desirable to speed the process.

It is further observed that the integral strain gage of the present invention is not limited to use for detecting strains associated with manufacturing process. The integral strain gage of the present invention also has other applications as a sensor. For example, force and deflection can be sensed in any number of applications.

Therefore an integral strain gage has been disclosed. The present invention contemplates numerous alternative embodiments, modifications, substitutions, and additions within the intended spirit and scope of the invention. Thus, the present invention is not to be limited to the specific embodiments described herein.

What is claimed is:

1. A layer for use in an assembly printed circuit board to provide for strain measurement on the printed circuit board, the layer comprising:
   an insulating layer having a top surface and a bottom surface;
   a strain sensitive layer of metallic foil adhered to the top surface of the insulating layer for measuring stain associated with the printed circuit board;
   a conductive coating disposed on the strain sensitive layer of metallic foil;
   wherein the strain sensitive layer is patterned to provide at least one strain gage feature; and
   wherein the conductive coating is patterned to provide at least one conductive feature for communicating with the printed circuit board.

2. The layer of claim 1 wherein the strain sensitive layer has a thickness of less than 2 mils.

3. The layer of claim 1 further comprising a second strain sensitive layer on the bottom surface of the insulating layer and a second conductive coating on the second strain sensitive layer.

4. The layer of claim 1 wherein the insulating layer is polyimide.

5. The layer of claim 1 wherein the conductive coating is a copper coating.

6. A printed circuit board comprising:
   a plurality of layers;
   wherein at least one of the plurality of layers is a strain measurement layer adapted to provide for strain measurement of the printed circuit board;
   wherein the at least one strain measurement layer comprises:
   (a) an insulating layer having a top surface and a bottom surface;
   (b) a strain sensitive layer of metallic foil adhered to the top surface of the insulating layer for measuring strain associated with the printed circuit board;
   (c) a conductive coating disposed on the strain sensitive layer of metallic foil;
   (d) wherein the strain sensitive layer is patterned to form at least one strain gage feature.

7. The printed circuit board of claim 6 wherein at least one strain sensitive layer includes an outer layer.

8. The printed circuit board of claim 6 wherein the at least one stain sensitive layer includes an inner layer.

9. The printed circuit board of claim 6 wherein the copper coating is patterned to form at least one feature; wherein the conductive coating adapted for communicating with one of the other layers of the printed circuit board.

10. The printed circuit board of claim 6 wherein the strain sensitive layer is patterned to form a plurality of strain gage features.

11. The printed circuit board of claim 6 wherein the insulating layer comprises polyimide.

12. The printed circuit board of claim 6 wherein the conductive coating is a copper coating.

13. A layer for integration into a printed circuit board comprised of a plurality of layers, the layer providing for strain measurement on the printed circuit board, the layer comprising:
    an insulating layer having a top surface and a bottom surface;
    a strain sensitive layer of metallic foil adhered to one of the top surface or bottom surface of the insulating layer for measuring strain associated with the printed circuit board;
    a conductive coating disposed on the strain sensitive layer of metallic foil;
    wherein the strain sensitive layer is patterned to provide at least one strain gage feature;
    wherein the conductive coating is patterned to provide at least one conductive feature electrically connected to a separate layer of the plurality of layers of the printed circuit board.

14. The layer of claim 13 wherein the at least one conductive feature is electrically connected to the separate layer using a via.

15. The layer of claim 13 wherein the strain sensitive layer provides a plurality of strain gage features for measuring strain at a plurality of locations within the printed circuit board.

* * * * *

UNITED STATES PATENT AND TRADEMARK OFFICE
CERTIFICATE OF CORRECTION

PATENT NO. : 7,094,061 B1
APPLICATION NO. : 11/063318
DATED : August 22, 2006
INVENTOR(S) : Thomas P. Kieffer and Robert B. Watson It is certified that error appears in the above-identified patent and that said Letters Patent is hereby corrected as shown below:

<u>Claim 6, Column 6, line 11</u>:
ADD:
after feature --; wherein the conductive coating adapted for communicating with one of the other layers of the printed circuit board--

<u>Claim 9, Column 6, line 17</u>:
DELETE:
after feature "; wherein the conductive coating adapted for communicating with one of the other layers of the printed circuit board"

Signed and Sealed this

Seventeenth Day of October, 2006

JON W. DUDAS
*Director of the United States Patent and Trademark Office*